(12) United States Patent
Le-Gall (10) Patent No.: US 8,572,447 B2
(45) Date of Patent: Oct. 29, 2013

(54) CIRCUITRY FOR BUILT-IN SELF-TEST

(75) Inventor: Hervé Le-Gall, Saint Martin d'Uriage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 218 days.

(21) Appl. No.: 13/154,378

(22) Filed: Jun. 6, 2011

(65) Prior Publication Data

US 2011/0302471 A1 Dec. 8, 2011

(30) Foreign Application Priority Data

Jun. 7, 2010 (FR) ...................................... 10 54446

(51) Int. Cl.
| | |
|---|---|
| *G01R 31/28* | (2006.01) |
| *G06F 11/00* | (2006.01) |
| *G06F 7/02* | (2006.01) |
| *H03M 13/00* | (2006.01) |

(52) U.S. Cl.
USPC ........... 714/733; 714/739; 714/819; 714/821; 714/56

(58) Field of Classification Search
USPC ......... 714/733, 738–739, 742, 744, 712, 715, 714/819, 820, 821, 43, 55–56, 49–50
See application file for complete search history.

(56) References Cited

U.S. PATENT DOCUMENTS

| | | | |
|---|---|---|---|
| 4,142,239 A | 2/1979 | Proto | |
| 4,687,980 A | 8/1987 | Phillips et al. | |
| 5,034,906 A | 7/1991 | Chang | |
| 6,675,337 B1 * | 1/2004 | Tung et al. | 714/733 |
| 7,610,526 B2 * | 10/2009 | Sherlock et al. | 714/724 |
| 2002/0124219 A1* | 9/2002 | Kuroki | 714/739 |
| 2008/0175055 A1* | 7/2008 | Kim | 365/185.11 |
| 2008/0178055 A1* | 7/2008 | Nakamura | 714/735 |

FOREIGN PATENT DOCUMENTS

GB 1326183 A 8/1973

OTHER PUBLICATIONS

French Search Report dated Jan. 26, 2011 from corresponding French Application No. 10/54446.
French Search Report dated Jan. 26, 2011 from related French Application No. 10/54445.

* cited by examiner

*Primary Examiner* — Christine Tu
(74) *Attorney, Agent, or Firm* — Wolf, Greenfield & Sacks, P.C.

(57) ABSTRACT

A method of testing a data connection using at least one test sequence, the method including providing a first bit sequence by a first generator; duplicating the first bit sequence to generate a second bit sequence identical to the first; and generating the at least one test sequence based on the first and second bit sequences and transmitting the at least one test sequence over a data connection to be tested.

32 Claims, 7 Drawing Sheets

CIRCUITRY FOR BUILT-IN SELF-TEST

CROSS REFERENCE TO RELATED APPLICATIONS

This application claims the priority benefit of French patent application Ser. No. 10/54446, filed on Jun. 7, 2011, entitled CIRCUITRY FOR BUILT-IN SELF-TEST, which is hereby incorporated by reference to the maximum extent allowable by law.

BACKGROUND OF THE INVENTION

1. Field of the Invention

The present invention relates to circuitry for performing a built-in self-test (BIST), and in particular, to a BIST method and circuit for generating and verifying a test sequence.

2. Discussion of the Related Art

With the increased complexity and clocking frequencies of integrated circuits, and the use of new technologies down to 32 nm, it is desirable to perform rigorous testing of the data connections between chips and/or input/output terminals of the integrated circuits. An aim of such tests is to ensure that a broad range of signals can be correctly transmitted and received over the data connections.

Built-in self-test (BIST) circuitry is a type of automatic test equipment for rigorously testing data connections between chips, and is integrated with the functional circuitry of the chip. The BIST circuitry generally comprises two main elements: a pseudo-random bit sequence (PRBS) generator, which generates a pseudo-random bit sequence to be used as a test sequence that is transmitted over the data connection during a testing phase; and verification circuitry, which checks that the test sequence is correctly received at the receive side.

A problem with existing BIST circuitry is that it can be relatively costly in terms of chip area. One of the reasons is that a PRBS generator is often provided at both the transmission and receive side. Furthermore, existing BIST circuitry generally does not allow flexibility in the stress applied by the test sequence. The stress is defined by the sequence length, and determines the maximum number of "0" or "1" bits that are generated by the PRBS generator in a row.

SUMMARY OF THE INVENTION

Embodiments at least partially overcome one or more problems in the prior art.

According to one embodiment, there is provided a method of testing a data connection using at least one test sequence, the method comprising: providing a first bit sequence by a first generator; duplicating said first bit sequence to generate a second bit sequence identical to the first; and generating said at least one test sequence based on said first and second bit sequences and transmitting said at least one test sequence over a data connection to be tested.

According to one embodiment, the test sequence comprises portions of each of the first and second bit sequences offset in time and/or spread across a plurality of lines.

According to one embodiment, the method further comprises: transmitting said at least one test sequence over a data connection; receiving said at least one test sequence by receive circuitry coupled to said data connection; and verifying that said first and second bit sequences are identical.

According to another embodiment, verifying that said first and second bit sequences are identical comprises performing an exclusive OR operation on at least two test signals received via said data connection.

According to another embodiment, said at least one test sequence is generated by transmitting, alternately, portions of said first and second bit sequences on a same line.

According to another embodiment, said at least one test sequence is generated by combining, by an exclusive OR logic function, said first bit sequence with a third bit sequence generated by a second generator.

According to another embodiment, said at least one test sequence comprises at least three test sequences, a first of said at least three test sequences comprising a combination of said first and third bit sequences, a second of said at least three test sequences comprising a combination of said second bit sequence with a fourth bit sequence generated by a third generator, and a third of said at least three test sequences comprising a combination of said third and fourth bit sequences.

According to another embodiment, there is provided circuitry for testing a data connection using at least one test sequence, the circuitry comprising: a first generator arranged to generate a first bit sequence; signal processing circuitry arranged to duplicate said first bit sequence to generate a second bit sequence identical to the first bit sequence, and to generate said at least one test sequence based on said first and second bit sequences.

According to one embodiment, said signal processing circuitry comprises an adapter block arranged to receive in parallel each of said first and second bit sequences at a first clock rate, and to alternately output, for transmission on a data lane of said data connection, portions of said first and second bit sequences at a second clock rate higher than said first clock rate.

According to another embodiment, said signal processing circuitry comprises at least one exclusive OR gate for combining at least one of said first and second PRBS with at least one further bit sequence.

According to yet another embodiment, there is provided a circuit comprising: a first circuit block comprising the above circuitry for generating at least one bit sequence; receive circuitry for receiving said at least one bit sequence via said data connection; and a comparator for detecting errors in said data transmission.

According to one embodiment, said receive circuitry comprises a first buffer adapted to receive a first portion of said test sequence generated based on said first bit sequence, and a second buffer adapted to receive a second portion of said test sequence generated based on said second bit sequence, wherein said comparator is arranged to compare the bits stored in said first and second buffers.

According to another embodiment, said receive circuitry comprises at least one XOR gate or at least on XNOR gate for combining two or more of said at least two test sequences.

According to another embodiment, said comparator comprises an XOR gate or an XNOR gate.

According to another embodiment, there is provided an integrated circuit comprising the above circuit.

According to another embodiment, there is provided an electronic device comprising the above integrated circuit.

BRIEF DESCRIPTION OF THE DRAWINGS

The foregoing and other purposes, features, aspects and advantages of embodiments will become apparent from the following detailed description of embodiments, given by way of illustration and not limitation with reference to the accompanying drawings, in which.

DETAILED DESCRIPTION

In the following description, only those aspects that are useful for an understanding of the embodiments have been described in detail. In particular, the main function of the circuit blocks during normal operation has not been described, the embodiments being applicable to any circuit blocks irrespective of their main function. Furthermore, the implementation of the data connection to be tested, which could be serial, parallel or any other type of connection, has not been described in detail, the embodiments being applicable to any type of data connection.

Figure 1:
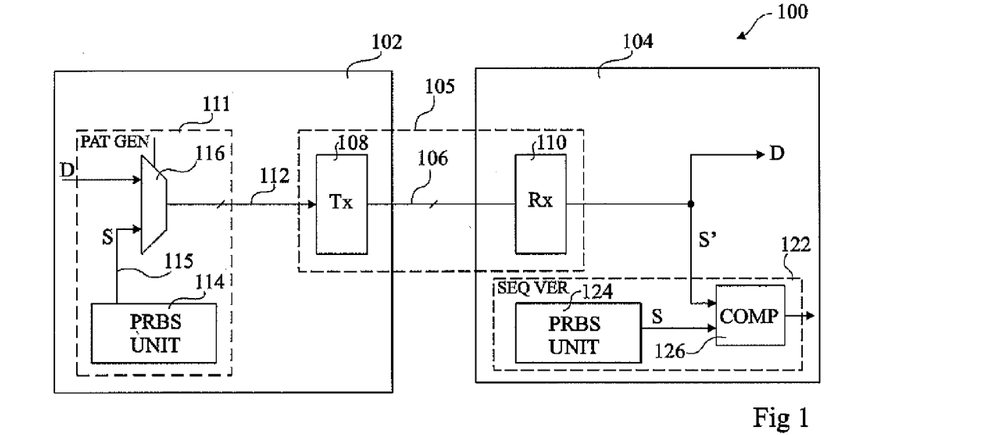
FIG. 1 illustrates circuit blocks coupled together via a data connection and comprising BIST circuitry according to an embodiment.

FIG. 1 illustrates circuitry 100 comprising circuit blocks 102 and 104, which are, for example, a pair of chips provided on an integrated circuit. In this example, the circuit block 102 transmits, via a data connection 105, data signals to circuit block 104. The data connection 105 comprises one or more data lanes 106 coupled between transmission circuitry 108 of circuit block 102 and receive circuitry 110 of circuit block 104.

The data connection 105 is for example a serial or parallel connection, and the transmission 108 and receive 110 circuitry for example implements the physical layer of the connection, by interfacing between one or more input data lines and the data lanes 106. Each data lane 106, for example, comprises a single wire, or a pair of differential wires to provide some noise compensation. It should be noted that a serial interface comprising more than one data lane is not the same as a parallel interface. In a parallel interface, the bits of a symbol, for example, 8 or 12 data bits, are transmitted at the same time over 8 or 12 separate data lanes, while in a serial interface, the data bits forming each data symbol are transmitted in series, one after the other over a same lane. For example, in a serial interface, a first byte is sent on the first data lane, a second byte is sent on the second data lane, and then a third byte is sent on the first data lane, and so on. However, the same byte is not distributed on many data lanes. Although not shown in FIG. 1, in addition to the data lanes 106, the data connection 105 may comprise one or more clock lanes, control lanes used for handshake protocols, etc.

During normal operation, a standard data signal D is sent on one or more lines 112 to the transmission circuitry 108 of the data connection 105.

During a test mode, a sequence generation circuit (PAT GEN) 111 replaces the standard data signal D by a test sequence S, comprising one or more bit sequences, which is sent on the one or more lines 112 to the transmission circuitry 108 of the data connection 105.

In particular, the circuitry 111 comprises a PRBS generation unit 114, which generates the one or more test sequences S and provides them on one or more lines 115 to an input of a multiplexer 116, which is controlled to select either the data signal D or the test sequence S for output on lines 112. Thus, during the test mode, the test sequence S is transmitted over the data connection 105 to test the data connection 105 for a broad range of signals.

On the receive side, during normal operation, the data D received via the data connection 105 is output from the receive circuitry 110 to the processing circuitry (not shown in FIG. 1) that performs the normal function of the circuit block 104.

During the test mode, the test sequence S' received via the data connection 105 is provided to sequence verification circuitry (SEQ VER) 122, which comprises a PRBS generation unit 124. Generation unit 124 is identical to generation unit 114 of the circuit block 102, and is controlled to generate the same bit sequence. After time adjustment of the data streams S and S', for example by adding some delay between the generation of S and S' (not illustrated), comparator 126 of the circuitry 122 compares the bit sequence S' received via the data connection 105 with the bit sequence S received from the PRBS generator 124. Differences detected by the comparator 122 allow the successfulness of the transmission over the data connection to be evaluated. The comparator 126 is for example implemented by an exclusive OR (XOR) gate, that compares the sequences S and S' bit by bit.

The test sequence generated by generators 114 and 124 has a determined stress value. The stress value is related to the sequence length of the bit stream, in other words the number of bits before the bit sequence repeats itself. The sequence length is equal to the number of possible states of the PRBS generator. In particular, each PRBS generator stores n-bits, and the combinations of possible values of these bits define the number of states of the generator.

Herein, the stress level will be referred to as an n-bit value, which represents the number of bits stored by the PRBS generator, and is also related to the maximum sequence of "0" or "1" bits in the output bit sequence. As will be described in more detail below, the implementation of an n-bit PRBS generally comprises n−1 flip-flops, and has a sequence length and number of states equal to $2^n-1$.

Errors often only occur in a data connection after a certain stress is reached, in other words after the transmission of a certain number of "0" or "1" bits in sequence. Thus the stress level is generally chosen based on the use that is expected to be made of the data connection. However, in some cases, the circuit blocks 102, 104 may be used for different applications, and thus it is desirable to provide a variable stress level. The stress level may be evaluated and associated with a metric that represents the stress.

Figure 2:
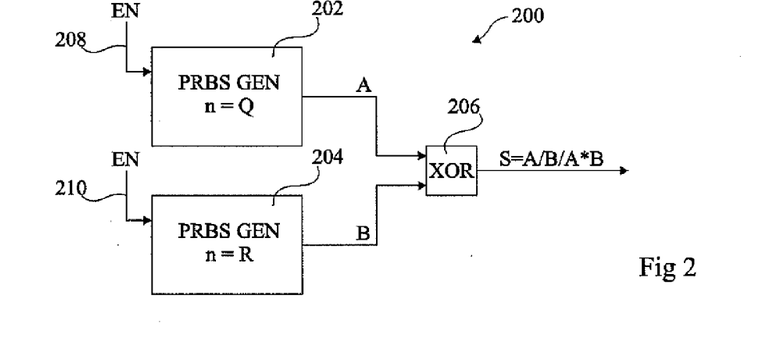
FIG. 2 illustrates a pseudo-random bit stream generation unit according to an embodiment.

FIG. 2 illustrates a PRBS generation unit 200, which for example implements the units 114 and 124 of FIG. 1, and allows a variable stress levels to be selected.

PRBS generation unit 200 comprises first and second PRBS generators 202 and 204. The PRBS generator 202 is a Q-bit generator, whereas the PRBS generator 204 is an R-bit generator, where Q and R are non-equal integers. Thus, the sequence A from generator 202 will have a Q-bit stress value, while the sequence B from generator 204 will have a R-bit stress value.

The sequences A and B are provided bit by bit to an XOR block 206, which generates an output bit sequence equal to the XOR of the sequences A and B, denoted herein as A*B. The sequence A, the sequence B and the sequence A*B each have a different stress level, and the generation unit 200 allows one of these three different stress levels to be applied. In particular, the generators 202 and 204 comprise enable inputs 208 and 210 respectively. If only generator 202 is enabled, the output sequence S of XOR 206 will be sequence A. If only generator 204 is enabled, the output sequence S XOR 206 will be sequence B. If both generators 204 and 206 are enabled, the output sequence S of XOR 206 will be sequence A*B.

A distinction can be made between two types of test sequences, one being called pseudo-random or PRBS (Pseudo-random bit stream), and the other being called more generally a test sequence. A PRBS sequence is generated by an n-bit generator having $2^n-1$ states, and thus a sequence length of $2^n-1$ bits. While a test sequence can be a pseudo-random sequence, it does not necessarily have a sequence length of $2^n-1$ bits. In the example of FIG. 2, the sequences A and B are PRBS sequences, and the sequence S is a test sequence, which may or may not be a pseudo-random sequence.

Obviously, the XOR gate 206 could be replaced by a block implementing a variation of the XOR function, such as an XNOR function, which is the inverse of the XOR function.

The number of states of each generator 202, 204, which is also equal to the sequence length of each generator, is equal to a prime number, or to the product of one or more prime numbers. In particular, the polynomial equation representing each n-bit PRBS is for example a primitive polynomial, meaning that it is irreducible, and thus, given certain conditions known to those skilled in the art, the sequence length is the prime number $2^n-1$. In some embodiments, the n values of each of the generators 202 and 204 are chosen such that there are no common prime numbers that make up the sequence lengths of each generator. In this way, for a given combination of generators, the combined sequence will have, at some point, the maximum stress level.

As an example, assuming that the two pseudo-random sequences generators 202, 204 are $n_1$-bit and $n_2$-bit generators respectively, the sequence lengths of sequences A and B will thus be $2^{n_1}-1$ and $2^{n_2}-1$ respectively. If $2^{n_1}-1$ is not prime and equal to K×L, and $2^{n_2}-1$ is not prime and equal to K×M, where K, L and M are all prime numbers, the combined sequence A*B will have a sequence length equal to K×L×M, which will be less than $(2^{n_1}-1)(2^{n_2}-1)$. Because the sequence length is reduced, the maximum stress level may never occur.

However, if $2^{n_1}-1$ is not prime and equal to K×L, and $2^{n_2}-1$ is not prime and equal to M×J, where K, L, M and J are all different prime numbers, the combined sequence A*B will have a sequence length equal to K×L×M×J, which is equal to $(2^{n_1}-1)(2^{n_2}-1)$.

Preferably, the values $n_1$ and $n_2$ are different prime numbers, as this implies the sequence lengths will be prime Mersenne numbers, in other words equal to $2^n-1$ where n is a prime number.

Table I below illustrates the values of n between 5 and 23, and the corresponding Mersenne numbers for each of these n values, shown as a product of prime numbers.

TABLE I

| N | $2^n - 1$ |
|---|---|
| 5 | 31 |
| 6 | 3 × 3 × 7 |
| 7 | 127 |
| 8 | 3 × 5 × 17 |
| 9 | 7 × 73 |
| 10 | 3 × 11 × 31 |
| 11 | 23 × 89 |
| 12 | 3 × 3 × 5 × 7 × 13 |
| 13 | 8191 |
| 14 | 3 × 43 × 127 |
| 15 | 7 × 31 × 151 |
| 16 | 3 × 3 × 5 × 31 × 47 |
| 17 | 131071 |
| 18 | 3 × 3 × 3 × 7 × 19 × 73 |
| 19 | 524287 |
| 20 | 3 × 5 × 5 × 11 × 31 × 41 |
| 21 | 7 × 7 × 127 × 337 |
| 22 | 3 × 23 × 89 × 683 |
| 23 | 47 × 178481 |

If a same prime number is present for two values of n in table I and the corresponding sequences are combined, this would imply that the shared prime number would occur only once in the calculation of the combined sequence length. Thus, for example, if the sequences of 6-bit and 9-bit PRBS generators were combined by an XOR operation, due to the repeating factor of 7, the resulting sequence would have a length of (3×3×7)×73=4599, and not (3×3×7)×(7×73)=32193. Alternatively, if the sequences of 7-bit and 8-bit PRBS generators were combined, the resulting sequence length would be 127×(3×5×17)=32385, while the total number of flip-flops in the two generators would be the same as in the 6-bit and 9-bit PRBS generators.

Alternatively, there may be one or more common prime numbers between the generators to be combined. In this case, the seed value of each generator is for example selected such that the maximum sequence of 0's and/or 1's occurs at a determined position in the sequence of each generator. In this way, the combined sequence can have a desired stress level.

Figure 3A:
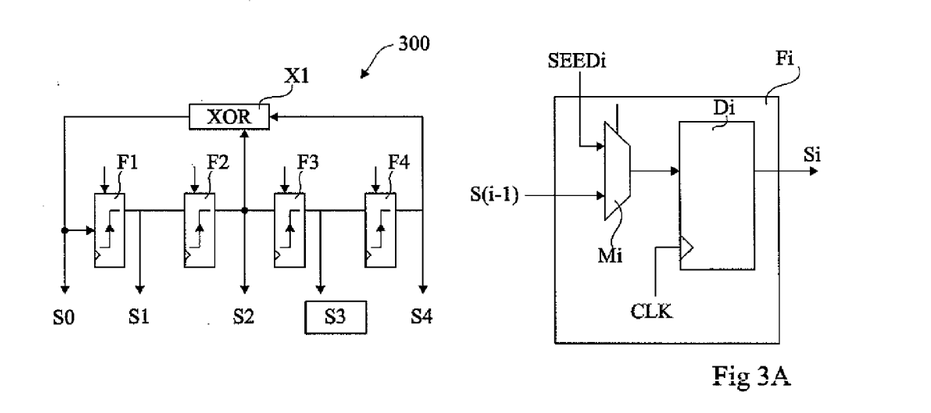
FIGS. 3A to 3J illustrate examples of pseudo-random generators according to embodiments.
Figure 3B:
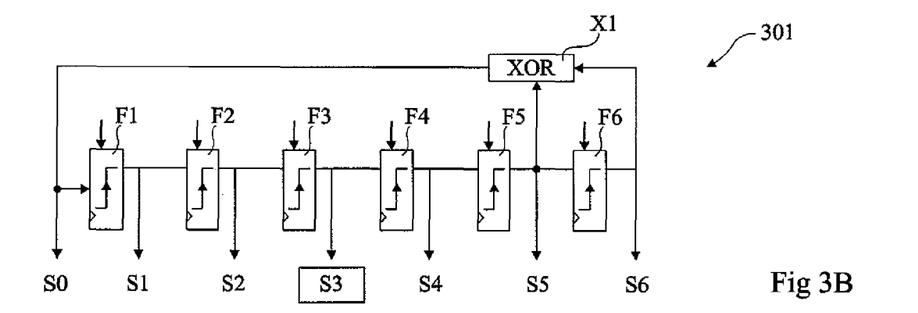

FIGS. 3A and 3B illustrate examples of implementations of 5-bit and 7-bit PRBS generators respectively, while FIGS. 3C to 3F illustrate examples of implementations of 8-bit PRBS generators, and FIGS. 3G to 3J illustrate examples of implementations of 9-bit, 11-bit, 12-bit, and 13-bit PRBS generators respectively, any of which may implement the Q-bit generator 202 or R-bit generator 204 of FIG. 2.

The PRBS generator 300 of FIG. 3A comprises 4 flip-flops F1 to F4 coupled in series, the output of flip-flop F4 being coupled to the input of an XOR gate X1, and the output of XOR gate X1 being couple to the input of flip-flop F1. The output of flip-flop F2 is coupled as a second input to the XOR gate X1. Each of the flip-flops is clocked by a clock signal CLK, such that they operate synchronously. To initialize PRBS generator 300 with a certain n-bit state, a seed input is provided to each flip-flop F1 to F4, as will now be described.

A flip-flop Fi is shown in FIG. 3A, which represents any of the flip-flops F1 to F4. As illustrated, flip-flop Fi comprises a multiplexer Mi having an input for receiving the signal S(i−1) from the previous flip-flop or from the XOR gate X1 in the case of flip-flop F1, and a second input for receiving a seed input bit SEEDi. The output of the multiplexer Mi is coupled to the data input of a D-type flip-flop Di, which is clocked by a clock signal CLK. The output of the flip-flop Di provides the output Si of the flip-flop Fi.

Thus, to inject a seed value into the PRBS 300, the multiplexer Mi of each flip-flop is controlled, via its control input, to select the corresponding seed input SEEDi to be provided to the corresponding flip-flop Di. On the next cycle of clock CLK, the multiplexer Mi is controlled to select the input S(i−1), and thus the sequence generated by the PRBS is initialized at the injected seed value.

While the output sequence may be taken from any of the outputs of each flip-flop, the output is for example the signal S3 at the output of the third flip-flop F3. The sequence length of any of the signals S0 to S4 will be of 31 bits, and at one stage in the sequence there will be maximum of five "1" and four "0" bits in a row.

The seed input is for example used as the enable input 208, 210 of FIG. 2 to enable or disable the generator 300. In particular, if a seed value of five 0's is injected into the PRBS, each of the signals S0 to S4 will then remain low. A constant logic "0" at one input of XOR gate 206 of FIG. 2 will simply allow the other input to XOR gate 206 to pass through.

Each of the PRBS generators 301 to 309 shown in FIGS. 3B to 3J has a similar structure to that of generator 300 of FIG. 3A. In particular, each comprises a series of flip-flops, each of which is for example implemented in a similar fashion to flip-flop Fi of FIG. 3A, having a seed input. The differences in each circuit are the number of flip-flops, and the number and connection of the XOR gates, as will now be described.

The 7-bit generator 301 of FIG. 3B comprises six flip-flop F1 to F6, and one XOR gate X1. The inputs of the XOR gate X1 are coupled to the outputs of the flip-flops F5 and F6 respectively.

Figure 3C:
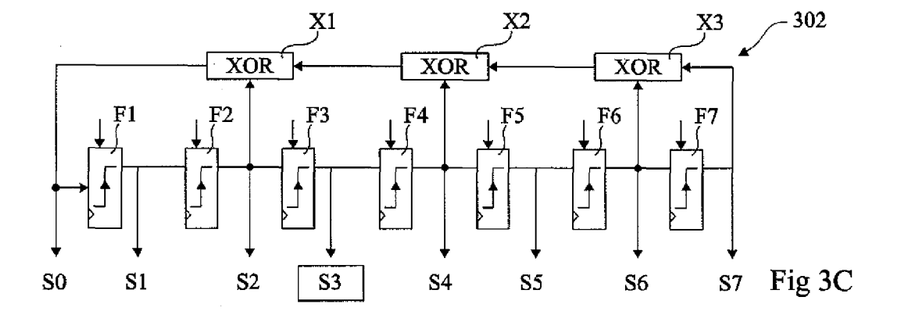

The 8-bit generator 302 of FIG. 3C comprises seven flip-flop F1 to F7, and three XOR gates X1, X2 and X3. The inputs of the XOR gate X1 are coupled respectively to the output of flip-flop F2 and to the output of the XOR gate X2. The inputs of the XOR gate X2 are coupled respectively to the output of flip-flop F4 and to the output of the XOR gate X3. The inputs of the XOR gate X3 are coupled to the outputs of flip-flops F6 and F7 respectively.

Figure 3D:
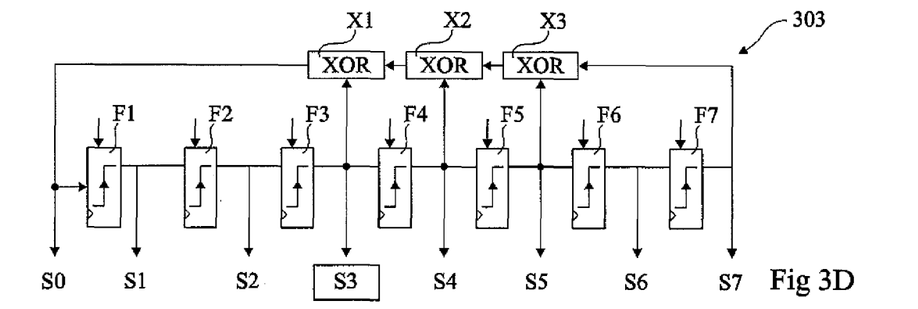

The 8-bit generator 303 of FIG. 3D comprises seven flip-flop F1 to F7, and three XOR gates X1, X2 and X1 The inputs of the XOR gate X1 are coupled respectively to the output of flip-flop F3 and to the output of the XOR gate X2. The inputs of the XOR gate X2 are coupled respectively to the output of flip-flop F4 and to the output of the XOR gate X3. The inputs of the XOR gate X3 are coupled to the outputs of flip-flops F5 and F7 respectively.

Figure 3E:
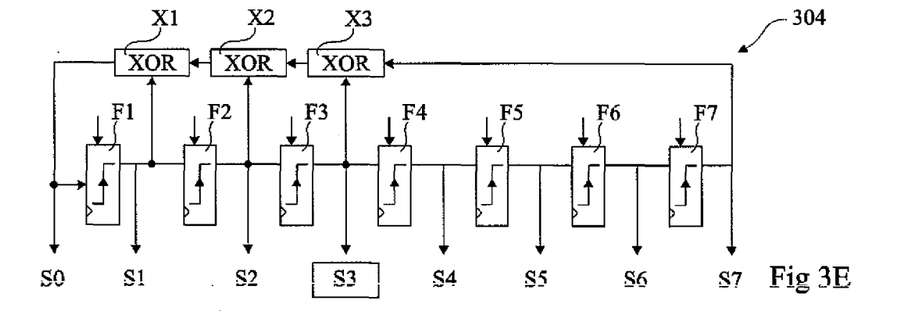
Figure 3F:
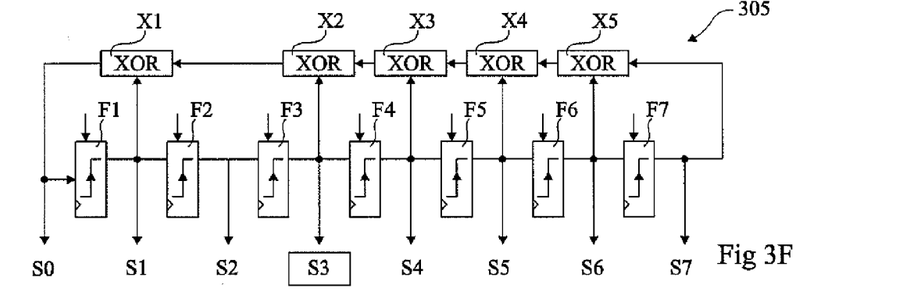

The 8-bit generator 304 of FIG. 3E comprises seven flip-flop F1 to F7, and three XOR gates X1, X2 and X3. The inputs of the XOR gate X1 are coupled respectively to the output of flip-flop F1 and to the output of the XOR gate X2. The inputs of the XOR gate X2 are coupled respectively to the output of flip-flop F2 and to the output of the XOR gate X3. The inputs of the XOR gate X3 are coupled to the outputs of flip-flops F3 and F7 respectively:

The 8-bit generator 305 of FIG. 3F comprises seven flip-flop F1 to F7, and five XOR gates X1, X2, X3, X4 and X5. Each of the XOR gates X1 to X4 has one input coupled to the output of the XOR gates X2 to X5 respectively, and the other input coupled to the output of flip-flops F1 and F3 to F5 respectively. The inputs of the XOR gate X5 are coupled to the outputs of flip-flops F6 and F7.

The four implementations 302 to 305 of the 8-bit PRBS generators demonstrate that it is possible to generate different sequences of the same length but having different values.

Figure 3G:
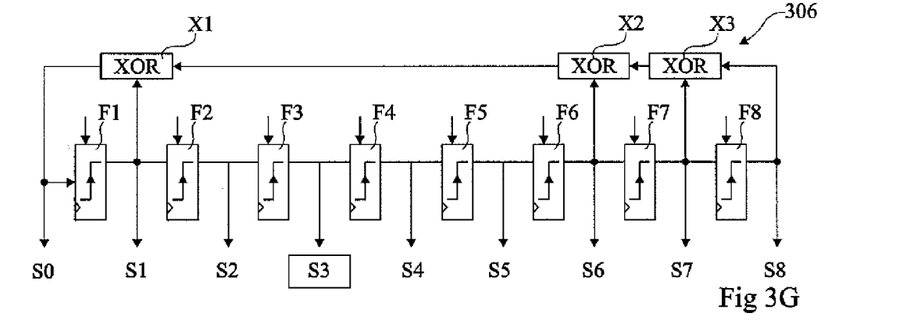

The 9-bit generator 306 of FIG. 3G comprises eight flip-flop F1 to F8, and three XOR gates X1, X2 and X3. The inputs of the XOR gate X1 are coupled respectively to the output of flip-flip F1 and to the output of the XOR gate X2. The inputs of the XOR gate X2 are coupled respectively to the output of flip-flop F6 and to the output of the XOR gate X3. The inputs of the XOR gate X3 are coupled to the outputs of flip-flops F7 and F8 respectively.

Figure 3H:
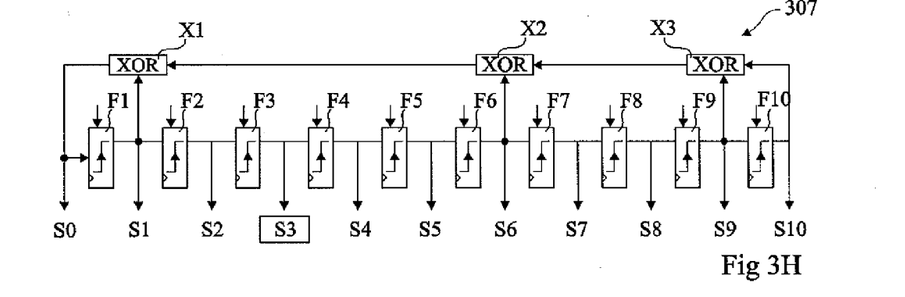

The 11-bit generator 307 of FIG. 3H comprises ten flip-flop F1 to F10, and three XOR gates X1, X2 and X3. The inputs of the XOR gate X1 are coupled respectively to the output of flip-flop F1 and to the output of the XOR gate X2. The inputs of the XOR gate X2 are coupled respectively to the output of flip-flop F6 and to the output of the XOR gate X3. The inputs of the XOR gate X3 are coupled to the outputs of flip-flops F9 and F10 respectively.

Figure 3I:
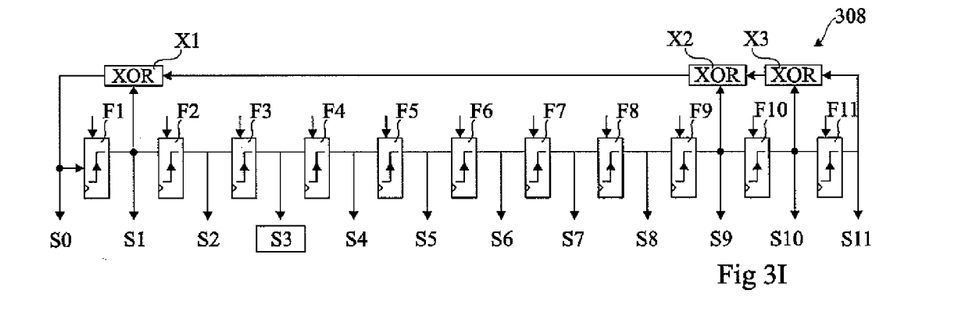

The 12-bit generator 308 of FIG. 3I comprises eleven flip-flop F1 to F11, and three XOR gates X1, X2 and X3. The inputs of the XOR gate X1 are coupled respectively to the output of flip-flop F1 and to the output of the XOR gate X2. The inputs of the XOR gate X2 are coupled respectively to the output of flip-flop F9 and to the output of the XOR gate X3. The inputs of the XOR gate X3 are coupled to the outputs of flip-flops F10 and F11 respectively.

Figure 3J:
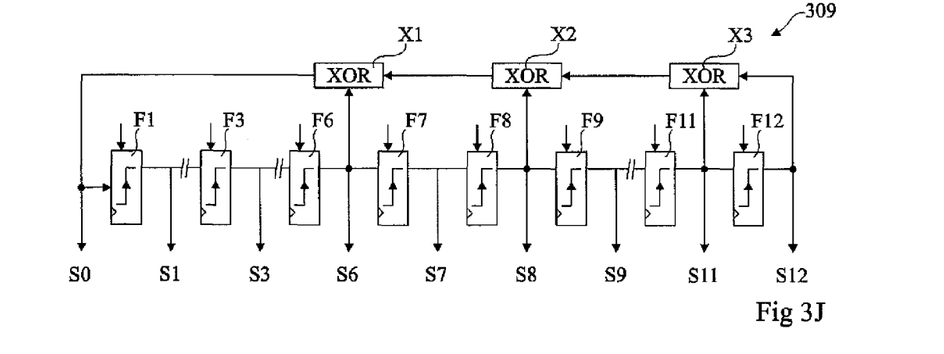

The 13-bit generator 309 of FIG. 3J comprises twelve flip-flop F1 to F12, and three XOR gates X1, X2 and X3, although for compactness, flip-flops F2, F4, F5 and F10 are not illustrated. The inputs of the XOR gate X1 are coupled respectively to the output of flip-flop F6 and to the output of the XOR gate X2. The inputs of the XOR gate X2 are coupled respectively to the output of flip-flop F8 and to the output of the XOR gate X3. The inputs of the XOR gate X3 are coupled to the outputs of flip-flops F11 and F12 respectively.

The PRBS generator 202 of FIG. 2 is for example implemented by one of the circuits 300, 301 and 306 to 309, while the PRBS generator 204 is for example implemented by a different one of the circuits 300, 301 and 306 to 309 or by one of the circuits 302 to 305.

Figure 4:
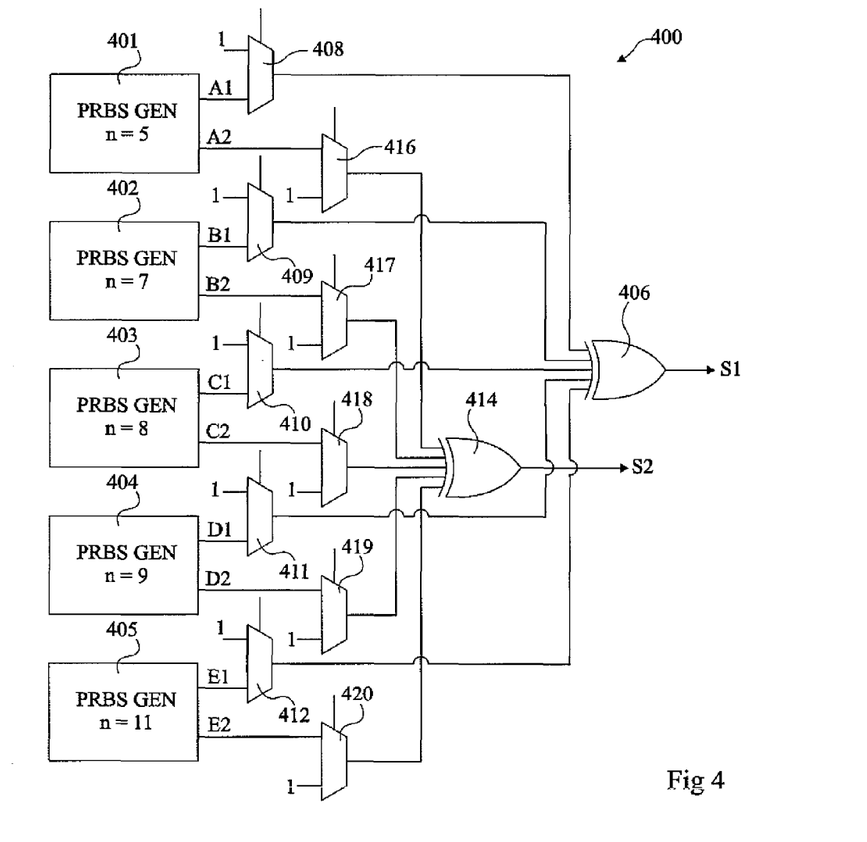
FIG. 4 illustrates a pseudo-random bit stream generation unit according to a further embodiment.

FIG. 4 illustrates a PRBS generation unit 400 according to an alternative example in which there are five PRBS generators 401 to 405, which are 5-bit, 7-bit, 8-bit, 9-bit and 11-bit PRBS generators respectively. These could for example be implemented by the circuits 300, 301, 302, 306 and 307 of FIGS. 3A, 3B, 3C, 3G and 3H respectively, although other circuits are possible.

A first output sequence A1, B1, C1, D1 and E1 of each generator 401 to 405 respectively, which is, for example, provided by the output of the flip-flop F1 of the corresponding generator, is coupled to one input of a corresponding multiplexer 408 to 412. The outputs of multiplexers 408 to 412 are coupled to corresponding inputs of a 5-input XOR gate 406. In a similar fashion, a second output sequence A2, B2, C2, D2 and E2 from each generator 401 to 405, which is for example provide by the output of the flip-flop F4 of the corresponding generator, is coupled to one input of a corresponding multiplexer 416 to 420. The outputs of multiplexers 416 to 420 are coupled to corresponding inputs of a 5-input XOR gate 414. Each of the multiplexers 408 to 412 and 416 to 420 is a two-input multiplexer, having its other input coupled to a logic "1" value.

Alternatively, the output sequences A1 and A2 could be sequences taken from different implementations of a 5-bit generator, and likewise for the output sequences B1 and B2, C1 and C2, D1 and D2 and E1 and E2. For example, C1 could be the sequence S1 from the 8-bit generator 302 of FIG. 3C, while C2 could be the sequence S1 from the 8-bit generator 303 of FIG. 3D.

By controlling the selection made by each multiplexer 408 to 412 and 416 to 420 via its selection input, the output of each multiplexer can be selected as the corresponding sequence A1 to E1, A2 to E2, or as a constant logic "1". A logic "1" will not affect the output of the corresponding XOR gate 406, 414. In this way, the output signal S1 from XOR gate 406 may be an XOR combination of any of the sequences A1 to E1, and the output signal S2 from the XOR gate 414 may be an XOR combination of any of the sequences A2 to E2.

For example, by controlling multiplexers 408, 409 and 410 to select signals A1 to C1, and multiplexers 411 and 412 to select the logic "1", the signal S1 is selected as A1*B1*C1, which would thus have a sequence length and stress similar to a 20-bit PRBS generator. At the same time, by controlling multiplexers 416, 417 and 418 to select the logic "1", and the multiplexers 419 and 420 to select the signals D2 and E2, the signal S2 is selected as D2*E2, which would thus also have a sequence length and stress similar to a 20-bit PRBS generator. The signals S1 and S2 could then be transmitted over parallel data lanes of the data connection 105 of FIG. 1.

In alternative embodiments, rather than using the multiplexers 408 to 412 and 416 to 420, the signals A1 to E1 and A2 to E2 could be activated or deactivated via the seed input of each generator, for example a signal being deactivated by injecting a seed value of all zeros into the corresponding generator. Furthermore, the signals A1 to E1 could be taken from the output of the same flip-flips as the signals A2 to E2, or from other flip-flops of these generators.

FIGS. 2 and 4 show just two examples of PRBS generation units. It will be apparent to those skilled in the art that alternative embodiments could comprise more or less PRBS generators, and generate any number of test signals based on any combination of two, three, four or more of the PRBS signals. In all cases, due to the way that the test signals are combined, the stress level of at least one of the generated PRBS signals will be variable, either via the seed input as shown in FIG. 1, or via a multiplexer as shown in FIG. 4, or via alternative means.

Figure 5:
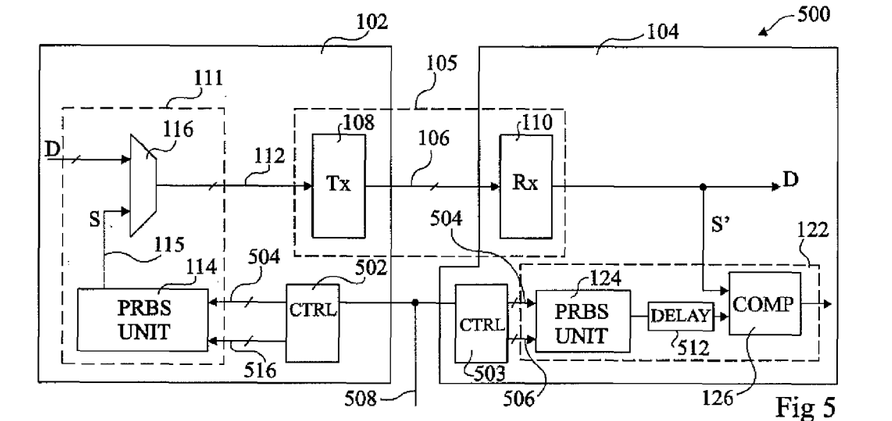
FIG. 5 illustrates circuit blocks coupled together via a data connection and comprising BIST circuitry according to a further embodiment.

FIG. 5 illustrates circuitry 500, which is similar to the circuitry 100 of FIG. 1, and comprises the circuit blocks 102, 104, data connection 105, and the sequence generation circuitry 111 and sequence verification circuitry 122, and these features will not be described in detail.

With respect to the circuitry 100 of FIG. 1, the circuitry 500 additionally comprises control blocks 502 and 503 in circuit blocks 102 and 104 respectively, coupled respectively to each of the PRBS generation units 114 and 124 by lines 504 and 506. Lines 504, for example, provide seed values to each of the PRBS generators of the units 114, 124, while lines 506 for example provide control signals for activating or deactivating one or more of the generators. Alternatively, the activation or deactivation may be performed using only the seed input, and thus lines 506 could be omitted in some embodiments.

An operating mode of each of the control blocks is for example controlled by a control signal on an input line 508, which for example indicates the stress level of the test sequence to be applied to the data connection 105. For example, assuming that four different stress levels may be applied by different combinations of PRBS generators in each unit 114, 124, the control signal on line 508 is for example a 2-bit value indicating which of the four stress levels is to be applied. The timing of this control signal may also provide timing information, such that the PRBS units 114, 124 operate synchronously. A delay block 512 is for example provided at the output of PRBS unit 124 for delaying the signal S by a delay corresponding to the delay introduced by the data connection, such that a meaningful comparison between S and S' can be made by comparator 126.

In alternative embodiments, the control blocks 502, 503 could both form part of one of the circuit blocks 102, 104, or could be provided elsewhere.

Figure 6:
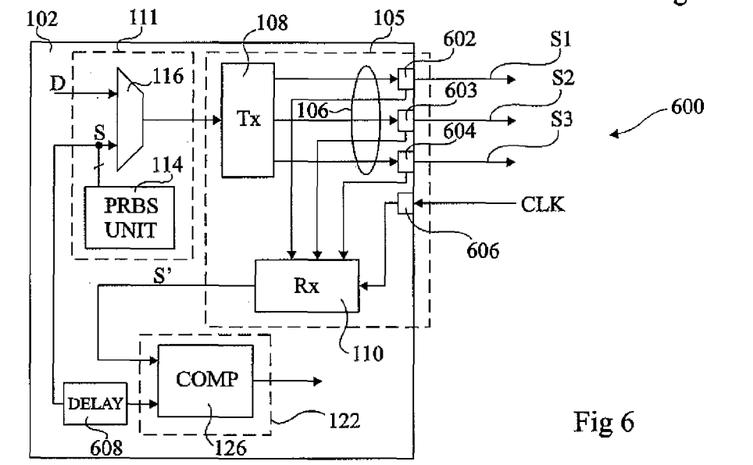
FIG. 6 illustrates a circuit block having an output interface comprising BIST circuitry according to an embodiment.

FIG. 6 illustrates circuitry 600, similar to FIG. 1, except that only the circuit block 102 is provided. In this example the circuitry 111, 122 is all implemented in the circuit block 102, and is arranged to test signals to be output via output pads 602, 603 and 604 of circuit 102. For example, pads 602 to 604 could form three of the connections that form an HDMI (high definition multimedia interface) output.

In this example, the data connection 105 is all implemented in the circuit block 104, and comprises the transmission block 108, which is coupled to the output pads 602 to 604, the data lanes 106 in this case comprising the connections to and from the pads 602 to 604, and receive circuitry 110, which is also coupled to the output pads 602 to 604. The receive circuitry 110 in this example is not used during the normal operation, and is provided for use only during the test mode.

The receive circuitry 110 also for example receives a clock signal CLK from a further pad 606, for controlling the timing of the reception of the test sequences. This clock signal is for example introduced by an operator on pad 606 during the test mode, or could be provided from within the circuit block 102.

The sequence verification circuitry 122 receives the data signal S' from the data connection 105, and in this example comprises only the comparator 126. In particular, in this embodiment it is possible for the PRBS generation unit 114 to provide one or more PRBS sequences for transmission over the data connection 105, and also to provide these sequences to the comparator 126, via a delay 608, such that they can be well synchronized with respect to the received sequences. The delay 608 introduces a delay similar to the delay introduced by the data connection 105, such that a meaningful comparison between S and S' can be made by comparator 126.

Figure 7:
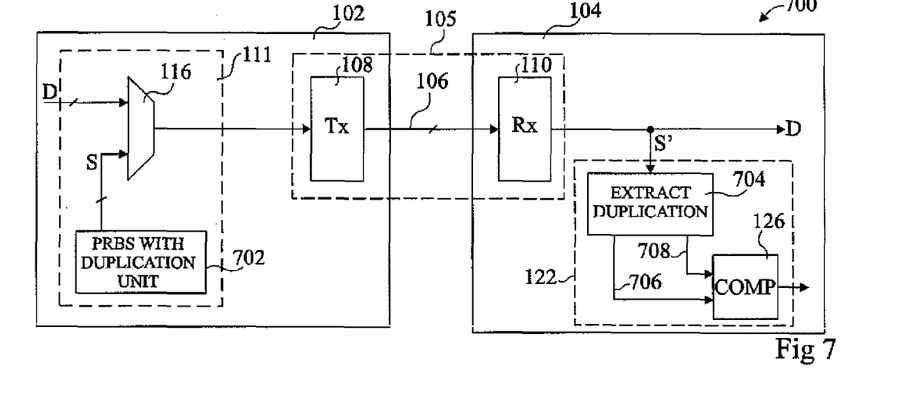
FIG. 7 illustrates circuit blocks coupled together via a data connection and comprising BIST circuitry according to a further embodiment.

FIG. 7 illustrates circuitry 700, which is similar to circuitry 100 of FIG. 1, and comprises circuit blocks 102 and 104 interconnected by a data connection 105. However, rather than comprising a PRBS generation unit in both the circuit blocks 102 and 104, a PRBS with duplication unit 702 is provided in the sequence generation circuitry 111 of circuit block 102, which generates one or more PRBS signals that include some duplication. Furthermore, the BIST circuitry 124 comprises a duplication extraction block 704, which provides signals on lines 706 and 708 to the comparator 126 for comparison. The comparator is for example implemented by a simple XOR gate, which performs the comparison bit by bit. By duplicating one or more PRBS that are transmitted over the data connection 105, the receive side is able to verify the correct reception of the data without using a further PRBS unit.

The duplication involves generating two identical versions of at least one sequence, for example of PRBS type, and generating the test sequence to be transmitted over the data connection 105 based on these two identical sequences. The test sequence may comprise portions of each duplicated sequence offset in time and/or spread across a plurality of lines, for example in combination with other signals. Such embodiments will now be described in more detail with reference to the examples of FIGS. 8A to 8E. For ease of illustration, the data connection 105, multiplexer 116 are not shown in these figures, but instead are indicated by a dashed line 801.

Figure 8A:
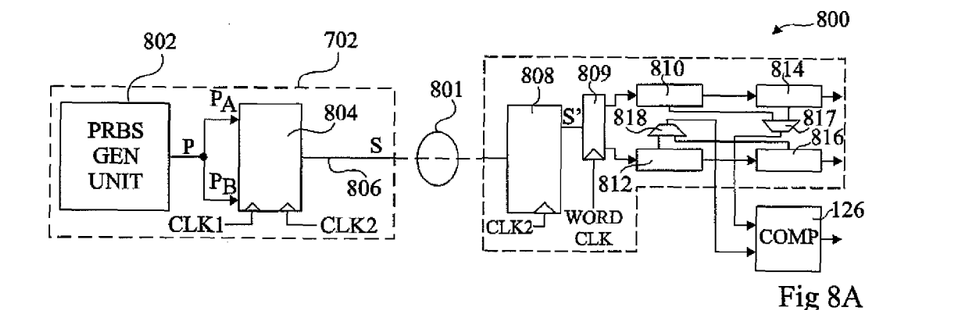
FIGS. 8A to 8E illustrate the circuitry of FIG. 7 in more detail according to various embodiments.

FIG. 8A illustrates circuitry 800 implementing the PRBS with duplication unit 702 and duplication extraction unit 704 of FIG. 7. The PRBS with duplication unit 702 comprises a PRBS generation unit 802, which, for example, comprises one or more PRBS generators, and may or may not allow a variable stress level to be selected. The PRBS generation unit 802 outputs a PRBS signal P, which is duplicated to provide, to an adapter block 804, duplicate sequences $P_A$ and $P_B$. These sequences are clocked into the adapter block 804 by a clock signal CLK1, which for example has half the frequency of the clock CLK2 used to time the output sequence S at the output of adapter block 804 to be sent over the data connection. The output sequence S comprises alternating portions of the sequences $P_A$ and $P_B$ offset in time with respect to each other, and for example comprises B bits of $P_A$ followed by B bits of $P_B$ followed by B bits of $P_A$ etc. B is for example equal to a word, such as 16 or 32 bits of data, although other sizes are possible.

At the receive side, the duplication extraction unit 704 comprises a synchronizing block 808, which is for example clocked by clock signal CLK2, which receives the sequence transmitted over the data connection 105, and provides this sequence S' to a splitter 809, for example, clocked by a signal WORD CLK. The splitter 809 provides consecutive groups of B bits of the received sequence S' to buffers 810, 812 alternately, which have outputs coupled to further buffers 814 and 816 respectively. The buffers 810 to 816 are for example FIFO (First In First Out) buffers, the size of each for example being B bits. A multiplexer 817 selects the contents of one of the buffers 810 and 814 to be provided bit by bit to one input of comparator 126, while a multiplexer 818 select the contents of one of the buffers 812 and 816 to be provided bit by bit to another input of comparator 126.

The selection by multiplexers 817 and 818 depends on the particular synchronization between the splitter 809 and the received stream. For example, assuming that the sequence S comprises words $P_{A1}, P_{B1}, P_{A2}, P_{B2}, P_{A3}$ etc., then the splitter may provide words PA1, PA2, PA3 etc. to buffer 810, and words PB1, PB2, PB3 etc. to buffer 812. In this case the contents of buffers 810 and 812 are for example supplied bit by bit to the inputs of comparator 126 for comparison. Alternatively, words $P_{B1}, P_{B2}, P_{B3}$ etc. may be provided to buffer 810, and words $P_{A2}, P_{A3}, P_{A4}$ etc. may be provided to buffer 812. In this case, the contents of buffers 812 and 814 are for example supplied bit by bit to the respective inputs of comparator 126 to check for errors. In some cases, if it is not known what synchronization the splitter has, the contents of each of buffers 810 and 814 could be compared with the contents of each of buffers 812 and 816, and it is verified that there is a match between the bits in at least one pair of these buffers.

Figure 8B:
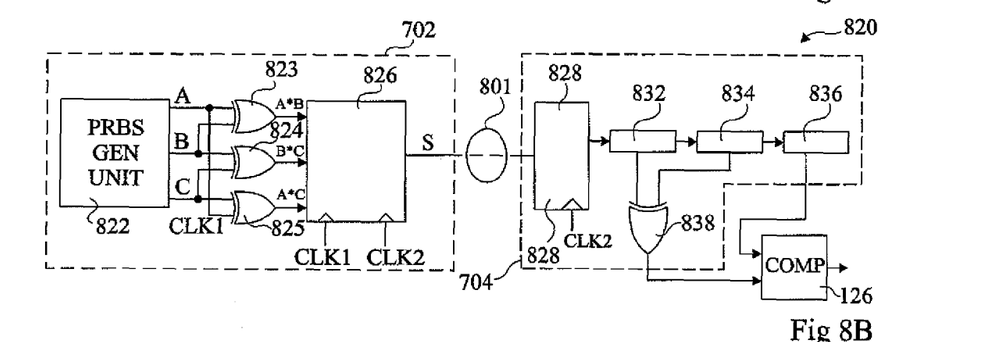

FIG. 8B illustrates an alternative example in which the PRBS with duplication unit 702 comprises a PRBS generation unit 822 that is arranged to generate three different signals A, B and C, each provided by a different n-bit PRBS generator. The signals A and B are inputted to an XOR 823 to provide the signal A*B, the signals B and C are inputted to an XOR 824 to provide the signal B*C, and the signals A and C are inputted to an XOR 825, to provide the signal A*C. The signals A*B, B*C and A*C are provided to an adapter block 826, which provides an output sequence S comprising bits from each of the sequences in turn, for example a first group of B bits from sequence A*B, followed by a second group of B bits from sequence B*C, followed by a third group of B bits from sequence A*C, followed by a fourth group of B bits from sequence A*B etc. B is for example equal to a word, such as 16 or 32 bits of data, although other sizes are possible. The sequences A*B, B*C and A*C are for example clocked into block 826 by a clock signal CLK1, and the sequence S is clocked out by a clock signal CLK2 having three times the frequency of CLK1. The outputs S is then transmitted over the data connection.

On the receive side, the duplication extraction unit 704 comprises a synchronizing block 828, which receives the sequence from the data connection 105, and provides the received sequence S' to a buffer 832, which is coupled in series with a further two buffers 834 and 836. The buffers 832 to 836 are for example FIFO buffers each having a size of B bits. An XOR gate 838 in this example performs an XOR between the bits stored in buffers 832 and 834. For example assuming that these buffers store words that should correspond to corresponding portions of the signals A*B and B*C, the XOR of these words performed bit by bit should generate the signal A*C. This may then be compared by the comparator 126 with the contents of the third buffer, which should store a word corresponding to the corresponding portion of the signal A*C. In fact, the XOR of any two of the sequences A*B, B*C and A*C should equal the third sequence, and thus an advantage of the configuration of FIG. 8B is that the verification can be applied in a simple fashion irrespective of which group of bits is in each buffer at any time.

Figure 8C:
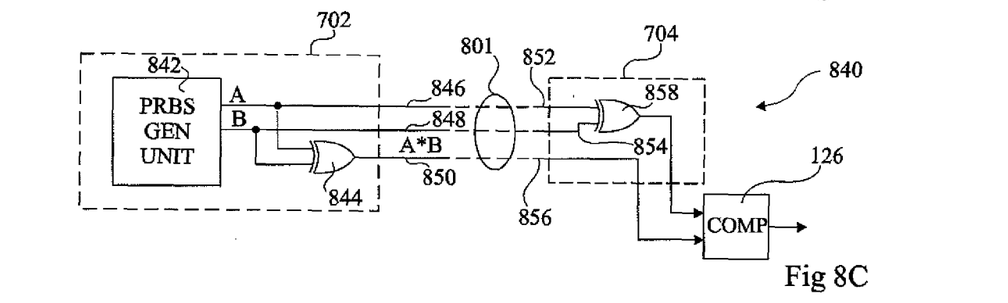

FIG. 8C illustrates circuitry 840 according to an alternative embodiment in which the data connection transmits three signals, such as three data signals, or two data signals and a valid signal. The PRBS with duplication unit 702 comprises a PRBS generation unit 842, which generates two PRBS signals A and B, generated by different n-bit generators, with the values of n for example being chosen to give the value $2^n-1$ different prime numbers. The unit 702 further comprises an XOR gate 844, which receives at its inputs the signals A and B, and generates a signal A*B. The three signals A, B and A*B are provided on respective lines 846, 848 and 850 to the data connection for transmission.

On the receive side, the signals that should correspond to the transmitted signals A, B and A*B are provided on lines 852, 854 and 856 respectively. Lines 852 and 854 are coupled to the inputs of an XOR gate 858, which thus should generate the signal A*B, and can thereby be compared to the signal on line 856 by the comparator 126.

Figure 8D:
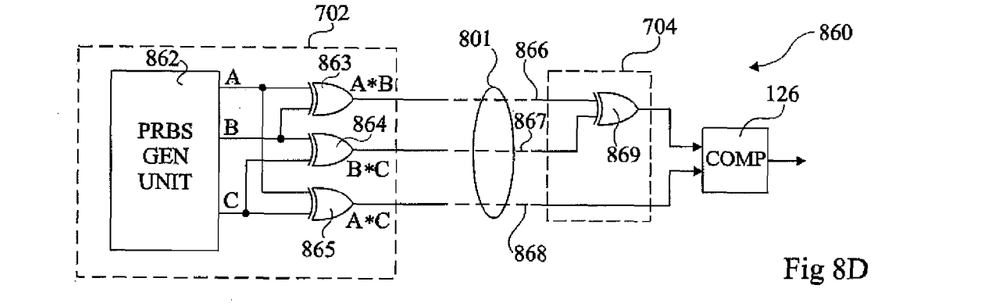

FIG. 8D illustrates an example similar to that of FIG. 8C, except the PRBS generation unit 862 generates three sequences A, B and C, and XOR gates 863, 864 and 865 are coupled to generate the signals A*B, B*C and A*C respectively, which are transmitted over the data connection. On the receive side, the signals that should represent signals A*B, B*C and A*C are received on lines 866, 867 and 868 respectively. In this example, the signals on lines 866 and 867 are inputted to an exclusive OR gate 869, such that the output of the XOR gate 869 should be the signal A*C. This output and the signal on line 868 are provided to the comparator 126.

Figure 8E:
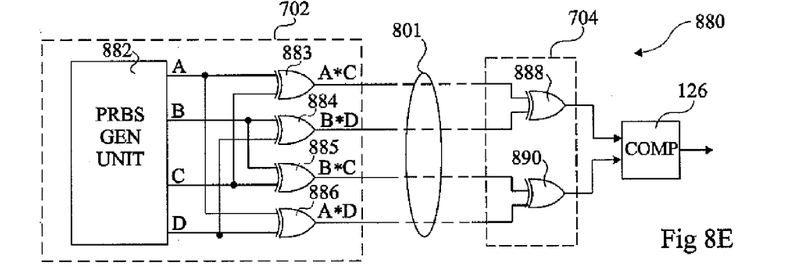

FIG. 8E illustrates a further example similar to that of FIG. 8D, except that the PRBS generation unit 882 generates four sequences A, B, C and D, and pairs of these sequences are combined by four XOR gates 883 to 886 to provide the signals A*C, B*D, B*C and A*D. On the receive side, an XOR gate 888 receives the signals that should be A*C and B*D, while an XOR gate 890 receives the signals that should be B*C and A*D, and thus both XOR gates 888 and 890 output a signal which should equal the same combined signal A*B*C*D. The outputs of XOR gates 888 and 890 are coupled to the inputs of comparator 126.

Figure 9:
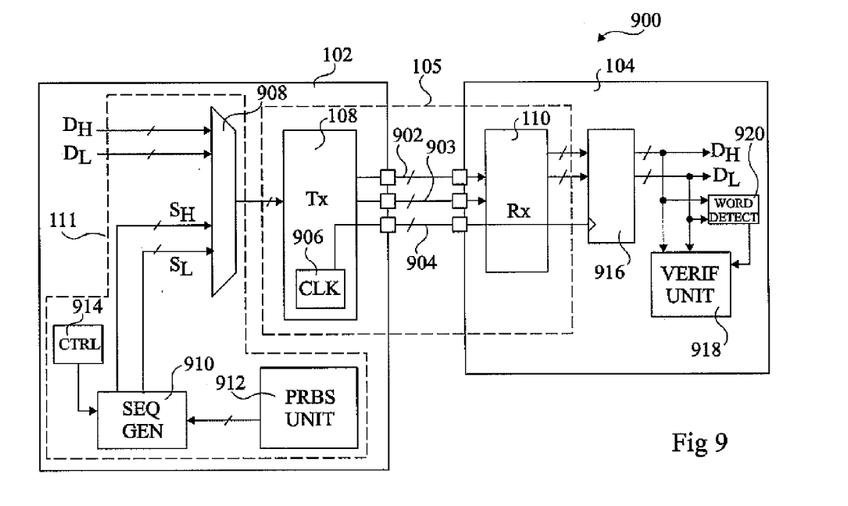
FIG. 9 illustrates circuit blocks coupled together via a data connection and comprising BIST circuitry according to yet a further embodiment.

FIG. 9 illustrates circuitry 900 of a further embodiment in which the data connection 105 is a serial connection that comprises a group of data lanes 902, for example four data lanes, and a clock lane 904, each lane being coupled between output pads of circuit block 102 and input pads of circuit block 104. The data connection 105 in this example is a DDR (double data-rate) memory interface, the circuit block 104 for example being a RAM (random access memory), and the circuit block 102 being a DMA (direct memory access) unit. Thus in normal operation, the data connection 105 is for example arranged to serially transmit on rising edges of clock CLK bits of data signals $D_H$ on lines 902, and on falling edges of clock CLK bits of data signals $D_L$ on lines 902. Each of the data signals $D_H$ and $D_L$ for example comprises four parallel bit streams.

The transmission circuitry 108 comprises a clock source 906 that provides the clock signal CLK.

The sequence generation circuitry 111 of circuit block 102 comprises a multiplexer 908, which receives the normal data signals $D_H$ and $D_L$ at corresponding inputs, and also test sequences $S_H$ and $S_L$ that respectively replace these signals during the testing of the data connection 105. Thus the multiplexer 908 will output to the transmission circuitry 108 of the data connection 105 either the data signals $D_B$ $D_L$, or the test sequences $S_H$, $S_L$.

The sequence generation circuitry 111 further comprises a sequence generator 910, which receives from the PRBS unit 912 a number of PRBS sequences, and determines the combination of these sequences to be transmitted as each connection, based on control signals from a control block 914. In one example, the PRBS generation unit 912 comprises one or two 5-bit PRBS generators that provides a pair of sequences $a_5$ and $A_5$, one or two 7-bit generator that provides a pair of sequences $b_7$ and $B_7$, one or more 8-bit generators that provides sequences $C1_8$, $C2_8$, $C3_8$ and $C4_8$, one or two 9-bit generator that provides a pair of sequences $d_9$ and $D_9$, one or two 11-bit generator that provides a pair of sequences $e_{11}$ and $E_{11}$, one or two 13-bit generator that provides a pair of sequences $f_{13}$ and $F_{13}$, one or two 17-bit generator that provides a pair of sequences $g_{17}$ and $G_{17}$ and one or two 19-bit generator that provides a pair of sequences $h_{19}$ and $H_{19}$. One PRBS generator may be used to generate more than one sequence of the same length by taking the output from different flip-flops of the generator. Alternatively, particularly in the case of the 8-bit generator, more than one generator with the same number of states may be implemented in different ways to provide the different sequences. The data lines 902 for example receive the following combination of signals:

TABLE II

| Line # | $S_H$ | $S_L$ |
|---|---|---|
| 0 | $a_5*e_{11}*C1_8$ | $b_7*d_9*C1_8$ |
| 1 | $A_5*E_{11}*C2_8$ | $B_7*D_9*C2_8$ |
| 2 | $a_5*E_{11}*C3_8$ | $b_7*D_9*C3_8$ |
| 3 | $A_5*e_{11}*C4_8$ | $B_7*d_9*C4_8$ |

Furthermore, to selectively increase or decrease the stress level, the 8-bit generators could be deactivated to remove the signals $C1_8$ to $C4_8$, and/or each of the sequences $S_H$ on lines 0 to 3 may for example be additionally combined with one or more of the sequences f13, g17 and h19, and each of the sequences $S_L$ on lines 0 to 3 may be additionally combined with one or more of the sequences $F_{13}$, $G_{17}$ and $H_{19}$.

On the receive side, a synchronization block 916, clocked by the clock signal CLK received via line 904 of the data connection 105, receives the signals from the receive circuitry 110, and provides these signals to a verification unit 918. A word detection block 920 is, for example, used to activate the test mode. In particular, a certain reference word is for example transmitted over the data connection at the start of the test mode, and when block 920 detects this word, it sends an activation signal to the verification unit 918. Unit 918 for example performs the following exclusive OR operations:

TABLE III

| Line# | $S_H*S_L$ |
|---|---|
| 0 | $a_5*e_{11}*b_7*d_9$ |
| 1 | $A_5*E_{11}*B_7*D_9$ |
| 2 | $a_5*E_{11}*b_7*D_9$ |
| 3 | $A_5*e_{11}*B_7*d_9$ |

Thus, by performing the exclusive OR operation between the data $S_H$ and $S_L$ on the high and low clock edges, the sequences $C1_8$ to $C4_8$ cancel. Then by performing the exclusive OR of the all four values in the column $S_H*S_L$ of table III, a null value should be obtained if no errors were introduced by the data connection 105.

As a further example, one of the signals transmitted on the high or low clock edges on one of the data lines could be combined by XOR with a global locator value GL, which means that in the absence of errors, the value GL will be obtained rather than a null value. The value GL is for example a count value, allowing the position of an error in the sequence to be detected. The receive side may know the values of GL, or know that the values of GL will have an expected progression from one 12-bit value to the next, such that errors can be detected.

Figure 10:
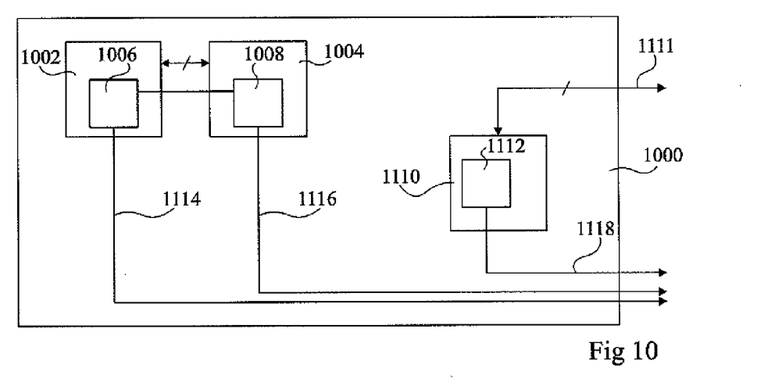
FIG. 10 illustrates an electronic device according to an embodiment.

FIG. 10 illustrates an electronic device 1000 comprising interconnected circuit blocks 1002, 1004, which for example each comprise BIST circuitry according to the embodiments described above for testing the data connection between them, for example in both directions. Furthermore, additionally or alternatively the device 1000 comprises a circuit block 1110 having a connection to an output 1111 of the device, and sequence generation circuitry 1112 according to the embodiments described herein for testing the data connection to the output 1111, for example as far as output pads of the circuit block 1110, or output pins of the output 1111 of the device. Each of the test circuitry 1006, 1008 and 1112 for example comprises an output line 1114, 1116 and 1118 respectively, for providing test data to an output of the device, such that it may be evaluated by an operator.

The device 1000 is for example a portable electronics device having one or more of the functions of a laptop computer, mobile telephone, digital still and/or video camera, portable games console, etc. Alternatively, device 1000 could be a set-top box, personal computer, television or other display, hard disk record, or other electronic device comprising data connections to be tested.

An advantage of the embodiments described herein that comprise more than one PRBS generator and circuitry for selectively combining their output signals is that a PRBS sequence having a variable stress may be obtained. It will be apparent to those skilled in the art that the number of different stress levels that may be selected depends on the number of generators of different stress values, and the number of lines of the data connection to be tested. An advantage of choosing the n values of the PRBS generators from the group 5, 7, 8, 9, 11, 13, 17 and 19 is that the prime numbers that individually or when multiplied form the sequence lengths of these generators will be unique, and thus the range of selectable stress levels will be high for the number of generators. Stress levels can be a relative value, and used to gauge the stress to be applied in different environments: for example for an automatic test or a final system test.

An advantage of the embodiments described herein that add redundancy to the test signal is that the verification of the test signal can be performed by a simple comparison without using a further PRBS generator. This also avoids synchronizing a PRBS generator on the receive side with a PRBS generator on the transmission side. In some advantageous embodiments, redundancy is added by generating three of more test sequences by combining in different combinations two or more different PRBS signals, and transmitting the three or more test sequences on a plurality of lines of the data connection to be tested, or in series over a same line of the data connection.

Having thus described at least one illustrative embodiment of the invention, various alterations, modifications and improvements will readily occur to those skilled in the art.

For example, it will be apparent to those skilled in the art that the PRBS generators of FIGS. 3A to 3J provide just some examples, and that other implementations of generators having the same or a different number of states could be used.

Furthermore, it will be apparent to those skilled in the art that each of the embodiments of FIGS. 8A to 8E could be adapted to combine a different number of sequences for transmission over a different number of lines. Also, the techniques for adding duplication could be combined, such that the duplication occurs in time and also across multiple lines.

Furthermore, it will be apparent to those skilled in the art that the various embodiments described herein could be combined in alternative embodiments in any combination. Furthermore, while some relatively simple examples have been provided, the principles described herein could be applied to data connections having a much larger number of data lines.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of testing a data connection using at least one test sequence, the method comprising:
   providing a first bit sequence by a first generator;
   duplicating said first bit sequence to generate a second bit sequence identical to the first; and
   generating said at least one test sequence based on said first and second bit sequences and transmitting said at least one test sequence over a data connection to be tested.

2. The method of claim 1, wherein the test sequence comprises portions of each of the first and second bit sequences offset in time and/or spread across a plurality of lines.

3. The method of claim 1, further comprising:
   transmitting said at least one test sequence over said data connection;
   receiving said at least one test sequence by receive circuitry coupled to said data connection; and
   verifying that said first and second bit sequences in said at least one test sequence are identical.

4. The method of claim 3, wherein receiving at least one test sequence comprises receiving at least two test sequences and wherein verifying that said first and second bit sequences are identical comprises performing an exclusive OR operation on the at least two test sequences received via said data connection.

5. The method of claim 1, wherein said at least one test sequence is generated by transmitting, alternately, portions of said first and second bit sequences on a same line.

6. The method of claim 1, wherein generating said at least one test sequence comprises combining, by an exclusive OR logic function, said first bit sequence with a third bit sequence generated by a second generator.

7. The method of claim 6, wherein said at least one test sequence comprises at least three test sequences, a first of said at least three test sequences comprising a combination of said first and third bit sequences, a second of said at least three test sequences comprising a combination of said second bit sequence with a fourth bit sequence generated by a third generator, and a third of said at least three test sequences comprising a combination of said third and fourth bit sequences.

8. Circuitry for testing a data connection using at least one test sequence, the circuitry comprising:
   a first generator arranged to generate a first bit sequence; and
   signal processing circuitry arranged to duplicate said first bit sequence to generate a second bit sequence identical to the first bit sequence, and to generate said at least one test sequence based on said first and second bit sequences.

9. The circuitry of claim 8, wherein said signal processing circuitry comprises an adapter block arranged to receive in parallel each of said first and second bit sequences at a first clock rate, and to alternately output, for transmission on a data lane of said data connection, portions of said first and second bit sequences at a second clock rate higher than said first clock rate.

10. The circuitry of claim 8, wherein said signal processing circuitry comprises at least one exclusive OR gate for combining at least one of said first and second bit sequences with at least one further bit sequence.

11. A circuit comprising:
    a first circuit block comprising the circuitry of claim 8 for generating said at least one test sequence;
    receive circuitry for receiving said at least one test sequence via said data connection; and
    a comparator for detecting errors in said data transmission.

12. The circuit of claim 11, wherein said receive circuitry comprises a first buffer adapted to receive a first portion of said test sequence generated based on said first bit sequence, and a second buffer adapted to receive a second portion of said test sequence generated based on said second bit sequence, wherein said comparator is arranged to compare the bits stored in said first and second buffers.

13. The circuit of claim 11, wherein said at least one test sequence comprises at least two test sequences and wherein said receive circuitry comprises at least one XOR gate or at least one XNOR gate for combining two or more of said at least two test sequences.

14. The circuit of claim 11, wherein said comparator comprises an XOR gate or an XNOR gate.

15. An integrated circuit comprising the circuit of claim 11.

16. An electronic device comprising the integrated circuit of claim 15.

17. A method for testing a data connection, comprising:
    generating, by a first generator, a first bit sequence;
    duplicating the first bit sequence to provide a second bit sequence identical to the first bit sequence;
    generating at least one test sequence including at least portions of the first and second bit sequences; and
    transmitting the at least one test sequence over the data connection.

18. A method for testing a data connection as defined in claim 17, wherein the first and second bit sequences comprise pseudo-random bit sequences.

19. A method for testing a data connection as defined in claim 17, wherein generating at least one test sequence comprises generating at least one test sequence wherein portions of the first and second bit sequences are offset in time.

20. A method for testing a data connection as defined in claim 17, wherein generating at least one test sequence comprises generating at least one test sequence wherein portions of the first and second bit sequences are transmitted on two or more lines of the data connection.

21. A method for testing a data connection as defined in claim 17, wherein generating at least one test sequence comprises generating at least one test sequence wherein portions of the first and second bit sequences are transmitted on a single line of the data connection.

22. A method for testing a data connection as defined in claim 17, wherein generating at least one test sequence comprises combining the first bit sequence with a third bit sequence generated by a second generator.

23. A method for testing a data connection as defined in claim 22, wherein generating at least one test sequence comprises generating a first test sequence comprising a combination of the first and third bit sequences, a second test sequence comprising a combination of the second bit sequence and a fourth bit sequence generated by a third generator, and a third test sequence comprising a combination of the third and fourth bit sequences.

24. A method for testing a data connection as defined in claim 17, further comprising receiving the at least one test sequence by receive circuitry coupled to the data connection, and verifying that the first and second bit sequences in the at least one test sequence are identical.

25. Apparatus for testing a data connection, comprising:
a first generator configured to generate a first bit sequence; and
a circuit configured to duplicate the first bit sequence to provide a second bit sequence identical to the first bit sequence and to generate at least one test sequence including at least portions of the first and second bit sequences.

26. Apparatus for testing a data connection as defined in claim 25, wherein the first and second bit sequences comprise pseudo-random bit sequences.

27. Apparatus for testing a data connection as defined in claim 25, wherein the circuit is configured to generate at least one test sequence wherein portions of the first and second bit sequences are offset in time.

28. Apparatus for testing a data connection as defined in claim 25, wherein the circuit is configured to generate at least one test sequence wherein portions of the first and second bit sequences are transmitted on two or more lines of the data connection.

29. Apparatus for testing a data connection as defined in claim 25, wherein the circuit is configured to generate at least one test sequence wherein portions of the first and second bit sequences are transmitted on a single line of the data connection.

30. Apparatus for testing a data connection as defined in claim 25, further comprising a second generator configured to generate a third bit sequence, wherein the circuit is configured to combine the first bit sequence and the third bit sequence.

31. Apparatus for testing a data connection as defined in claim 30, wherein the circuit is configured to generate at least one test sequence comprising a first test sequence including a combination of the first and third bit sequences, a second test sequence comprising a combination of the second bit sequence and a fourth bit sequence generated by a third generator, and a third test sequence comprising a combination of the third and fourth bit sequences.

32. Apparatus for testing a data connection as defined in claim 25, further comprising receive circuitry configured to receive the at least one test sequence via the data connection, and a comparator configured to detect errors in the received at least one test sequence.

* * * * *